United States Patent
Cok

(10) Patent No.: US 7,508,130 B2
(45) Date of Patent: *Mar. 24, 2009

(54) OLED DEVICE HAVING IMPROVED LIGHT OUTPUT

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 581 days.

This patent is subject to a terminal disclaimer.

(21) Appl. No.: 11/282,885

(22) Filed: Nov. 18, 2005

(65) Prior Publication Data

US 2007/0114925 A1 May 24, 2007

(51) Int. Cl.
*H05B 33/00* (2006.01)
*H01J 1/62* (2006.01)

(52) U.S. Cl. ............... 313/512; 313/504; 313/506; 313/112

(58) Field of Classification Search ............... None
See application file for complete search history.

(56) References Cited

U.S. PATENT DOCUMENTS

| | | |
|---|---|---|
| 4,476,292 A | 10/1984 | Ham et al. |
| 4,769,292 A | 9/1988 | Tang et al. |
| 5,247,190 A | 9/1993 | Friend et al. |
| 5,869,929 A * | 2/1999 | Eida et al. ............... 313/501 |
| 5,955,837 A | 9/1999 | Horikx et al. |
| 6,226,890 B1 | 5/2001 | Boroson et al. |
| 6,268,695 B1 | 7/2001 | Affinito |
| 6,392,340 B2 | 5/2002 | Yoneda et al. |
| 6,413,645 B1 | 7/2002 | Graff et al. |
| 6,522,067 B1 | 2/2003 | Graff et al. |
| 6,777,871 B2 | 8/2004 | Duggal et al. |

(Continued)

FOREIGN PATENT DOCUMENTS

WO    WO 01/82390    11/2001

(Continued)

OTHER PUBLICATIONS

C. W. Tang et al; "Organic Electroluminescent Diodes"; Applied Physics Letter; vol. 51; No. 12; Sep. 21, 1987; pp. 913-915.

(Continued)

*Primary Examiner*—Ashok Patel
(74) *Attorney, Agent, or Firm*—Andrew J. Anderson; Raymond L. Owens

(57) ABSTRACT

An organic light-emitting diode (OLED) device, comprising: one or more OLED elements including first and second spaced-apart electrodes with one or more organic layers formed there-between, at least one organic layer being a light-emitting layer, wherein at least one of the electrodes is a transparent electrode, and wherein the light-emitting layer has a first refractive index; a first transparent encapsulating layer formed over the transparent electrode opposite the organic layer; a scattering layer formed over the first encapsulating layer opposite the transparent electrode; a second encapsulating layer formed over the scattering layer opposite the first transparent encapsulating layer; a transparent cover through which light is emitted having a second refractive index; and a low-index element having a refractive index lower than the first and second refractive indices formed between the second encapsulating layer and the transparent cover.

20 Claims, 2 Drawing Sheets

U.S. PATENT DOCUMENTS

| | | | |
|---|---|---|---|
| 6,787,796 B2 | 9/2004 | Do et al. | |
| 7,208,863 B2 * | 4/2007 | Strip | 313/112 |
| 7,276,848 B2 * | 10/2007 | Cok et al. | 313/504 |
| 2001/0026124 A1 | 10/2001 | Liu et al. | |
| 2004/0061136 A1 | 4/2004 | Tyan et al. | |
| 2004/0183433 A1 * | 9/2004 | Cho et al. | 313/504 |
| 2004/0217702 A1 | 11/2004 | Garner et al. | |
| 2005/0018431 A1 | 1/2005 | Shiang | |
| 2005/0194896 A1 | 9/2005 | Sugita et al. | |
| 2007/0013291 A1 * | 1/2007 | Cok et al. | 313/501 |

FOREIGN PATENT DOCUMENTS

| | | |
|---|---|---|
| WO | WO 02/37568 | 5/2002 |
| WO | WO 02/37580 | 5/2002 |
| WO | WO 03/090260 | 10/2003 |
| WO | WO 2004/105149 | 12/2004 |

OTHER PUBLICATIONS

C. W. Tang, S. A. VanSlyke, and C. H. Chen; "Electroluminescence Of Doped Organic Thin Films"; Journal Applied Physics; vol. 65; No. 9; May 1, 1989; pp. 3610-3616.

A. N. Safonov et al; "Modification Of Polymer Light Emission By Lateral Microstructure"; Synthetic Metals; 116; 2001; pp. 145-148.

Tetsuo Tsutsui et al; "Sharply Directed Emission In Organic Electroluminescent Diodes With An Optical-Microcavity Structure"; Applied Physics Letters; vol. 65; No. 15; Oct. 10, 1994; pp. 1868-1870.

John M. Lupton et al; "Bragg Scattering From Periodically Microstructured Light Emitting Diodes"; Applied Physics Letters; vol. 77; No. 21; Nov. 20, 2000; pp. 3340-3342.

Ronald S. Cok et al; "OLED Device Having Improved Light Output"; U.S. Appl. No. 11/065,082, filed Feb. 24, 2005.

* cited by examiner

OLED DEVICE HAVING IMPROVED LIGHT OUTPUT

FIELD OF THE INVENTION

The present invention relates to organic light-emitting diode (OLED) devices, and more particularly, to OLED device structures for improving light output and lifetime.

BACKGROUND OF THE INVENTION

Organic light-emitting diodes (OLEDs) are a promising technology for flat-panel displays and area illumination lamps. The technology relies upon thin-film layers of organic materials coated upon a substrate. OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc.

OLED devices can employ a variety of light-emitting organic materials patterned over a substrate that emit light of a variety of different frequencies, for example red, green, and blue, to create a full-color display. However, patterned deposition is difficult, requiring, for example, expensive metal masks. Alternatively, it is known to employ a combination of emitters, or an unpatterned broad-band emitter, to emit white light together with patterned color filters, for example red, green, and blue, to create a full-color display. The color filters may be located on the substrate, for a bottom-emitter, or on the cover, for a top-emitter. For example, U.S. Pat. No. 6,392, 340 entitled "Color Display Apparatus having Electroluminescence Elements" issued May 21, 2002 illustrates such a device. However, such designs are relatively inefficient since approximately two thirds of the light emitted may be absorbed by the color filters.

It has been found that one of the key factors that limits the efficiency of OLED devices is the inefficiency in extracting the photons generated by the electron-hole recombination out of the OLED devices. Due to the relatively high optical indices of the organic and transparent electrode materials used, most of the photons generated by the recombination process are actually trapped in the devices due to total internal reflection. These trapped photons never leave the OLED devices and make no contribution to the light output from these devices. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

A typical OLED device uses a glass substrate, a transparent conducting anode such as indium-tin-oxide (ITO), a stack of organic layers, and a reflective cathode layer. Light generated from such a device may be emitted through the glass substrate. This is commonly referred to as a bottom-emitting device. Alternatively, a device can include a substrate, a reflective anode, a stack of organic layers, and a top transparent cathode layer. Light generated from such an alternative device may be emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

In any of these OLED structures, the problem of trapped light remains. Referring to FIG. 3, a bottom-emitting OLED device as known in the prior art is illustrated having a substrate 10 (in this case transparent), a transparent first electrode 12, one or more layers 14 of organic material, one of which is light-emitting, a reflective second electrode 16, a gap 19 and a cover 20. The gap 19 is typically filled with desiccating material. Light emitted from one of the organic material layers 14 can be emitted directly out of the device, through the transparent substrate 10, as illustrated with light ray 1. Light may also be emitted and internally guided in the transparent substrate 10 and organic layers 14, as illustrated with light ray 2. Additionally, light may be emitted and internally guided in the layers 14 of organic material, as illustrated with light ray 3. Light rays 4 emitted toward the reflective electrode 16 are reflected by the reflective first electrode 12 toward the substrate 10 and follow one of the light ray paths 1, 2, or 3. In some prior-art embodiments, the electrode 16 may be opaque and/or light absorbing. This OLED display embodiment has been commercialized, for example in the Eastman Kodak LS633 digital camera. The bottom-emitter embodiment shown may also be implemented in a top-emitter configuration with a transparent cover and top electrode 16.

It is also well known that OLED materials are subject to degradation in the presence of environmental contaminants, in particular moisture. Organic light-emitting diode (OLED) display devices typically require humidity levels below about 1000 parts per million (ppm) to prevent premature degradation of device performance within a specified operating and/ or storage life of the device. Control of the environment to this range of humidity levels within a packaged device is typically achieved by encapsulating the device with an encapsulating layer and/or by sealing the device, and/or providing a desiccant within a cover. Desiccants such as, for example, metal oxides, alkaline earth metal oxides, sulfates, metal halides, and perchlorates are used to maintain the humidity level below the above level. See for example U.S. Pat. No. 6,226, 890 B1 issued May 8, 2001 to Boroson et al. describing desiccant materials for moisture-sensitive electronic devices. Such desiccating materials are typically located around the periphery of an OLED device or over the OLED device itself.

In alternative approaches, an OLED device is encapsulated using thin multi-layer coatings of moisture-resistant material. For example, layers of inorganic materials such as metals or metal oxides separated by layers of an organic polymer may be used. Such coatings have been described in, for example, U.S. Pat. Nos. 6,268,695, 6,413,645 and 6,522,067. A deposition apparatus is further described in WO2003090260 A2 entitled "Apparatus for Depositing a Multilayer Coating on Discrete Sheets". WO0182390 entitled "Thin-Film Encapsulation of Organic Light-Emitting Diode Devices" describes the use of first and second thin-film encapsulation layers made of different materials wherein one of the thin-film layers is deposited at 50 nm using atomic layer deposition (ALD) discussed below. According to this disclosure, a separate protective layer is also employed, e.g. parylene and/or $SiO_2$. Such thin multi-layer coatings typically attempt to provide a moisture permeation rate of less than $5 \times 10^{-6}$ gm/m$^2$/day to adequately protect the OLED materials. In contrast, typically polymeric materials have a moisture permeation rate of approximately 0.1 gm/m$^2$/day and cannot adequately protect the OLED materials without additional moisture blocking layers. With the addition of inorganic moisture blocking layers, 0.01 gm/m$^2$/day may be achieved and it has been reported that the use of relatively thick polymer smoothing layers with inorganic layers may provide the needed protection. Thick inorganic layers, for example 5 microns or more of ITO or ZnSe, applied by conventional deposition techniques such as sputtering or vacuum evaporation may also provide adequate protection, but thinner conventionally coated layers may only provide protection of 0.01 gm/m$^2$/day. WO2004105149 A1 entitled "Barrier Films for Plastic Substrates Fabricated by Atomic Layer Deposition" published Dec. 2, 2004 describes gas permeation barriers that can be deposited on plastic or glass substrates by atomic layer deposition (ALD). Atomic Layer Deposition is also known as Atomic Layer Epitaxy (ALE) or atomic layer CVD (ALCVD), and reference to ALD herein is intended to refer to all such equivalent processes. The use of the ALD coatings can reduce permeation by many orders of magnitude at thicknesses of tens of nanometers with low concentrations of coating defects. These thin coatings preserve the flexibility and transparency of the plastic substrate. Such articles are useful in container, electrical, and electronic applications. However, such protective layers also cause additional problems with light trapping in the layers since they may be of lower index than the light-emitting organic layers.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145-148, and "Bragg scattering from periodically microstructured light emitting diodes" by Lupton et al., Applied Physics Letters, Vol. 77, No. 21, Nov. 20, 2000, pp. 3340-3342. Brightness enhancement films having diffractive properties and surface and volume diffusers are described in WO0237568 A1 entitled "Brightness and Contrast Enhancement of Direct View Emissive Displays" by Chou et al., published May 10, 2002. The use of micro-cavity techniques is also known; for example, see "Sharply directed emission in organic electroluminescent diodes with an optical-microcavity structure" by Tsutsui et al., Applied Physics Letters 65, No. 15, Oct. 10, 1994, pp. 1868-1870. However, none of these approaches cause all, or nearly all, of the light produced to be emitted from the device.

Chou (International Publication Number WO 02/37580 A1) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has an optical index that matches these layers. Light emitted from the OLED device at higher than critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic electroluminescent display device and method of manufacturing the same" by Do et al issued Sep. 7, 2004 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed.

Light-scattering layers used externally to an OLED device are described in U.S. Patent Application Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic Electroluminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3).

However, scattering techniques, by themselves, may cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, as illustrated in FIG. 4, a prior-art pixellated bottom-emitting OLED device may include a plurality of independently controlled sub-pixels 30, 32, 34, 36, and 38 and a scattering layer 22 located between the transparent first electrode 12 and the substrate 10. A light ray 5 emitted from the light-emitting layer may be scattered multiple times by scattering layer 22, while traveling through the substrate 10, organic layer(s) 14, and transparent first electrode 12 before it is emitted from the device. When the light ray 5 is finally emitted from the device, the light ray 5 has traveled a considerable distance through the various device layers from the original sub-pixel 30 location where it originated to a remote sub-pixel 38 where it is emitted, thus reducing sharpness. Most of the lateral travel occurs in the substrate 10, because that is by far the thickest layer in the package. Also, the amount of light emitted is reduced due to absorption of light in the various layers.

U.S. Patent Application Publication No. 2004/0061136 entitled "Organic light emitting device having enhanced light extraction efficiency" by Tyan et al., describes an enhanced light extraction OLED device that includes a light scattering layer. In certain embodiments, a low index isolation layer (having an optical index substantially lower than that of the organic electroluminescent element) is employed adjacent to a reflective layer in combination with the light scattering layer to prevent low angle light from striking the reflective layer, and thereby minimize absorption losses due to multiple reflections from the reflective layer. The particular arrangements, however, may still result in reduced sharpness of the device.

Co-pending, commonly assigned U.S. Ser. No. 11/065, 082, filed Feb. 24, 2005, describes the use of a transparent low-index layer having a refractive index lower than the refractive index of the encapsulating cover or substrate through which light is emitted and lower than the organic layers to enhance the sharpness of an OLED device having a scattering element. US 20050194896 describes a nano-structure layer for extracting radiated light from a light-emitting device together with a gap having a refractive index lower than an average refractive index of the emissive layer and nano-structure layer. Such disclosed designs, however, are difficult to manufacture, and may still not extract all of the available light in the presence of conventional encapsulation layers that may be employed to protect the OLED from environmental damage.

There is a need therefore for an improved organic light-emitting diode device structure that avoids the problems noted above and improves the lifetime, efficiency, and sharpness of the device.

SUMMARY OF THE INVENTION

In accordance with one embodiment, the invention is directed towards an organic light-emitting diode (OLED) device, comprising: one or more OLED elements including first and second spaced-apart electrodes with one or more organic layers formed there-between, at least one organic layer being a light-emitting layer, wherein at least one of the electrodes is a transparent electrode, and wherein the light-emitting layer has a first refractive index; a first transparent encapsulating layer formed over the transparent electrode opposite the organic layer; a scattering layer formed over the first encapsulating layer opposite the transparent electrode; a second encapsulating layer formed over the scattering layer opposite the first transparent encapsulating layer; a transparent cover through which light is emitted having a second refractive index; and a low-index element having a refractive index lower than the first and second refractive indices formed between the second encapsulating layer and the transparent cover.

ADVANTAGES

The present invention has the advantage that it increases the light output from, improves the sharpness of, and improves the environmental protection for an OLED device.

It will be understood that the figures are not to scale since the individual layers are too thin and the thickness differences of various layers too great to permit depiction to scale.

DETAILED DESCRIPTION OF THE INVENTION

Figure 1:
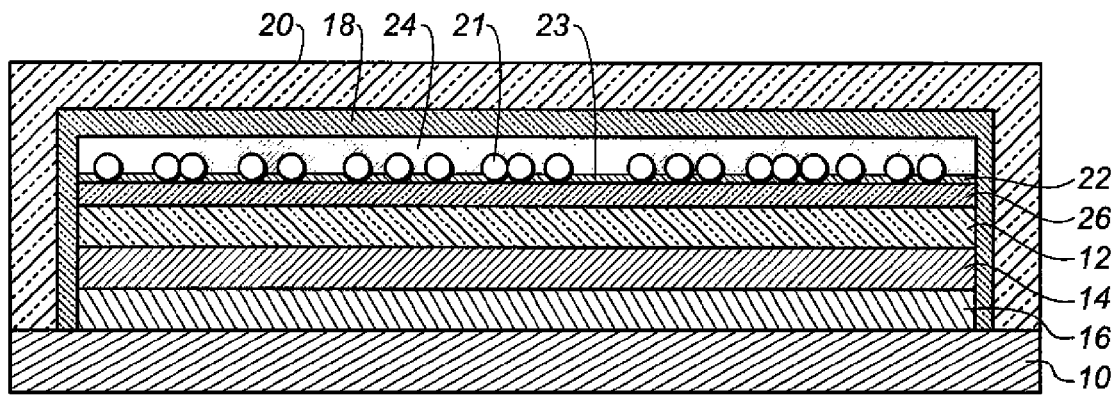
FIG. 1 illustrates a cross section of an OLED device having encapsulation and scattering layers according to one embodiment of the present invention.

Referring to FIG. 1, in accordance with one embodiment of the present invention, an OLED device comprises one or more OLED elements including first and second spaced-apart electrodes 12 and 16 with one or more organic layers 14 formed there-between, at least one organic layer being a light-emitting layer. Electrode 12 is a transparent electrode, and the light-emitting layer has a first refractive index. A first transparent encapsulating layer 26 is formed over the transparent electrode 12 opposite the organic layer 14; a scattering layer 22 is formed over the first transparent encapsulating layer 26 opposite the transparent electrode 12; a second encapsulating layer 24 formed over the scattering layer 22 opposite the first encapsulating layer 26. Transparent cover 20 through which light is emitted has a second refractive index; and a low-index element 18 having a refractive index lower than the first and second refractive indices is formed between the second encapsulating layer 24 and the transparent cover 20. The various layers of the OLED device may be formed on a substrate 10. An encapsulating layer within the context of the present invention is a layer that provides a moisture permeation rate of less than about $10^{-3}$ gm/m$^2$/day. Preferably, the first and second encapsulating layers in combination provide a moisture permeation rate of less than about $10^{-5}$ gm/m$^2$/day, to adequately protect OLED materials.

Figure 2:
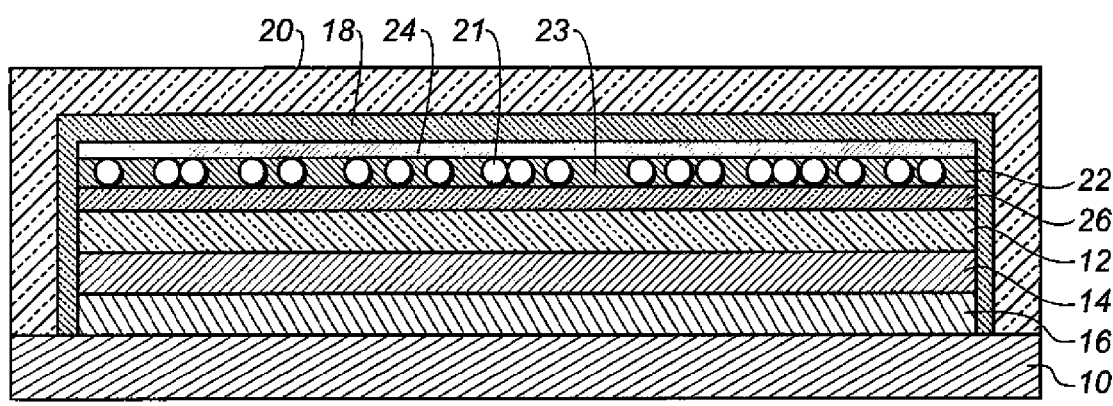
FIG. 2 illustrates a cross section of an OLED device having encapsulation and scattering layers according to an alternative embodiment of the present invention.

Scattering layer 22 comprises individual scattering particles 21. Such particles may be dispersed in a binder 23 to facilitate coating and adhesion. The binder may be coated at a thickness less than the average scattering particle size as illustrated in FIG. 1. The second encapsulating layer 24 may thus be conformally coated over individual light-scattering particles 21, as shown in FIG. 1. Alternatively the binder 23 may be coated at a thickness equal to or greater than the particle size as illustrated in FIG. 2, such that the particles 21 are dispersed in the binder matrix. In the former case (FIG. 1), the second encapsulating layer 24 preferably has a refractive index different from that of the light-scattering particles 21. In the latter case (FIG. 2), the matrix 23 will itself have a refractive index different from that of the light-scattering particles 21 so that layer 22 may function as a scattering layer. Light-scattering particles 21 may comprise, for example, particles of titanium dioxide. Preferably, such particles are at least 100 nm in diameter, and more preferably at least 400 nm, to optimize the scattering of visible light. The binder or matrix 23 may be formed of, for example a polymeric material.

Very thin layers of material suitable for the first encapsulating layer 26 may be formed of a variety of materials, such as metal oxides deposited in thin layers. In one embodiment of the present invention, the encapsulating layer 24 formed adjacent to the transparent second electrode 12 comprises at least one component layer formed by atomic layer deposition. For example, applicants have demonstrated an atomic layer deposition process whereby trimethylaluminum is first deposited over the partially transparent electrode 12 using chemical vapor deposition followed by exposure to oxygen in the form of ozone. The aluminum and oxygen combine to form a very thin layer of $Al_2O_3$. The process may then be repeated until a plurality of layers comprising a suitable thickness is achieved. Such a multi-layer is highly transparent and provides a thin-film (for example less than 1 micron thick) encapsulating layer with very low permeation rates (for example on the order of $10^{-6}$ $gm/m^2/day$). Subject to providing desired optical and encapsulation properties, the thin-film encapsulating layer may be less than 1 micron thick and preferably less than 400 nm and more preferably less than 100 nm. Other materials and processes may also be employed, for example as described in the "Handbook of Thin Film Process Technology" published by the Institute of Physics Publishing, 1995, edited by Glocker and Shah or as described in the "Handbook of Thin Film Materials" published by the Academic Press, Harcourt, Inc. 2002, edited by Nalwa (vol. 1, chapter 2 "Atomic Layer Deposition" by Ritala and Leskala).

Useful thin film encapsulating layer materials which may be deposited by atomic layer deposition can include Zn, ZnSe, $ZnS_{1-x}$, $Se_x$, ZnTe, CaS, SrS, BaS, $SrS_{1-x}$, $Se_x$, CdS, CdTe, MnTe, HgTe, $Hg_{1-x}$, $Cd_xTe_x$, $Cd_{1-x}Mn_x$, Te, AlN, GaN, InN, $SiN_x$, $Ta_3N_5$, TiN, TiSiN, TaN, NbN, MoN, $W_2N$, $Al_2O_3$, $TiO_2$, $ZrO_2$, $HfO_2$, $Ta_2O_5$, $Nb_2O_5$, $Y_2O_3$, MgO, $CeO_2$, $SiO_2$, $La_2O$, $SrTiO_3$, $BaTiO_3$, $Bi_xTi_y$, $O_z$, Indium Tin Oxide, Indium Oxide, $SnO_2$, NiO, $Co_3O_4$, MnOx, $LaCoO_3$, $LaNiO_3$, LaMnO3, $CaF_2$, $SrF_2$, $ZnF_2$, Si, Ge, Cu, Mo, Ta, W, $La_2S_3$, PbS, $In_2S_3$, $CuGaS_2$, and SiC (x, y, and z positive integers).

Encapsulating layers according to another embodiment of the present invention may include alternating organic and inorganic layers, for example of polymer and ceramic films, such as those sold under the Barix trade name by Vitex Systems, Inc.

These materials typically have a relatively low optical index and may therefore trap emitted light within the OLED layers if employed in layers thicker than the wavelength of emitted light.

Moreover, the use of thin layers of encapsulating materials may be problematic, particularly in the case of large areas, since particulate contamination may be present and the layers are relatively fragile and easily shattered. If a contaminating particle is present during encapsulating layer deposition and subsequently removed, for example during the coating of a light scattering layer, pinholes may be formed allowing the ingress of environmental hazards such as moisture. Therefore the use of a mechanically robust second encapsulating layer 24 is helpful to protect the OLED device. A variety of materials may be used to form the second encapsulating layer 24, including various metal or silicon oxides, for example indium tin oxide, aluminum oxide, or silicon dioxide, nitrides such as silicon nitride, and parylene. These materials are all known in the art. Moreover, established means may be employed to deposit the encapsulating layer, for example by evaporation, coating, sputtering, or atomic layer deposition. However, such layers may be difficult to form at sub-micron thicknesses and, as demonstrated by applicant, are preferably more than one micron thick to provide adequate mechanical and environmental robustness. In particular, any contaminating particles are preferably completely covered by the encapsulating layer to maintain a complete seal over the surface of the OLED device. However, such materials formed in thick layers typically have a relatively low index of optical refraction and also trap light.

Thus applicants have demonstrated through experiments that the use of a thin moisture barrier (i.e. layer 26) is subject to pinhole defects and may trap light. The use of a thick, mechanically robust layer to cover particulate contamination does not provide an adequate encapsulation against moisture and may also trap light. The use of both encapsulating layers together effectively provides a moisture barrier and covers pinholes due to particulate contamination but also traps light.

A scattering layer 22 may be provided over the transparent electrode 12 as taught in the prior art. However, it has been found that such scattering layers may degrade the transparent electrode 12 and/or organic materials 14 when deposited using typical deposition methods (e.g., organic or aqueous solvent coating processes) on the transparent electrode 12. If the scattering layer 22 is provided over a conventional thick encapsulating layer, light may still remain trapped in the OLED layers, as such thick encapsulating layers typically are comprised of materials having a relatively low optical index. By providing the scattering layer between the encapsulating layer 24 and the transparent electrode 12, light that would otherwise remain trapped both within the encapsulating layer 24 and the organic layer(s) 14 and transparent electrode 12 is exposed to the direction-altering effects of the scattering layer 22. Hence, by providing a scattering layer 22 between the first and second encapsulating layers 26 and 24, light may be extracted from the OLED device while providing protection from moisture and particle contamination and enabling the deposition of scattering particles 21 over the transparent electrode layer 12. It is preferred that the first encapsulating layer 26 be thin, for example less than one micron, preferably less than 400 nm, and more preferably less than 100 nm to allow light to pass through the first encapsulating layer 26 without trapping light (in the case that the first encapsulating layer 26 has a lower index than the organic layer(s) 14). The second encapsulation layer 24 can be of any useful thickness, preferably greater than one micron to cover particulate contaminants. Hence the present invention may prolong the lifetime and improve the efficiency of an OLED device.

Figure 4:
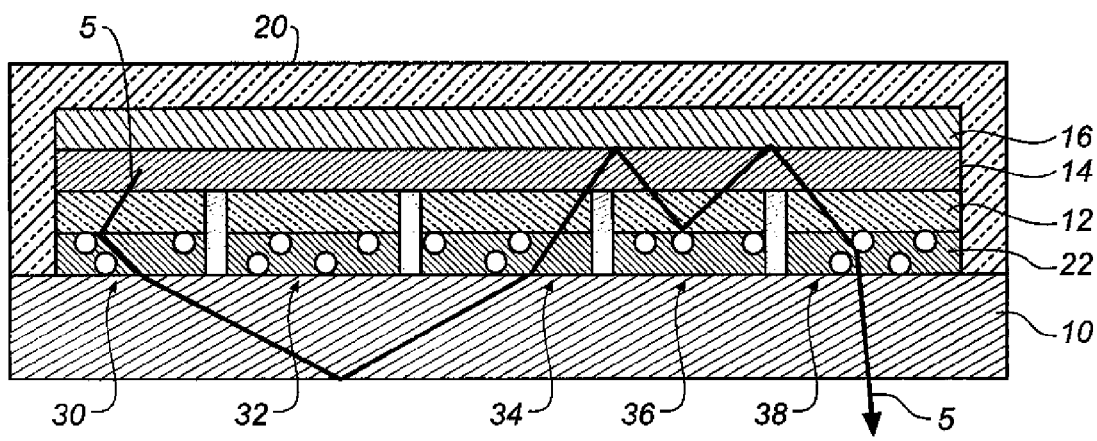
FIG. 4 illustrates the path of a light ray within a cross section of a prior-art bottom-emitter OLED device having a scattering layer.

As noted above in reference to FIG. 4, the use of a scattering layer 22 within a pixilated OLED device results in a loss of sharpness. If the organic layer(s) 14 has a first refractive index and the transparent cover 20 through which light is emitted has a second refractive index, a low-index element 18 having a third refractive index lower than the first refractive index and second refractive index may be formed between the encapsulation layer 24 and the transparent cover 12 through which light is emitted to reduce the sharpness loss. To facilitate this effect, the transparent low-index element 18 should not itself scatter light, and should be as transparent as possible. The transparent low-index element 18 is preferably at least one micron thick to ensure that emitted light properly propagates through the transparent low-index element and is transmitted through the encapsulating cover 20.

Figure 3:
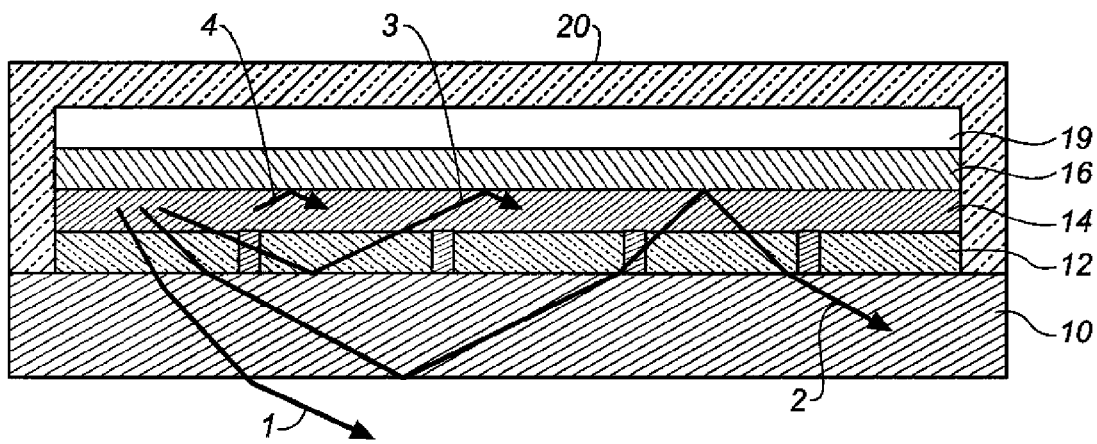
FIG. 3 illustrates the path of light rays within a cross section of a prior-art bottom-emitter OLED device.

Referring to FIG. 2, the present invention may operate as follows. Upon the application of a voltage across the electrodes 12 and 16, light is emitted by the organic layer(s) 14 through which current passes. This light is emitted in all directions, as illustrated in FIG. 3. Light that would have been trapped in the organic layer(s) 14 or transparent electrode 12 is scattered by scattering layer 22. The first encapsulating layer 26 is preferably so thin that no light may be trapped therein. If a thicker layer is employed, some light may be trapped within the organic layer(s) 14 and transparent electrode 12, depending on the relative optical indices of the materials in the respective layers relative to the first encapsulating layer 26. Scattered light may then be emitted into the second encapsulating layer 24 at such an angle that it escapes into the low-index gap 18. Once in the low-index gap 18, the light may pass into the cover 20 but cannot be trapped there since the cover 20 has an optical index higher than that of the low-index gap, as taught in co-pending, commonly assigned U.S. Ser. No. 11/065,082 referenced above, the disclosure of which is incorporated by reference herein in its entirety. Light emitted into the encapsulating layer 24, at a higher angle and that does not pass into the low-index gap 18, will be reflected from the interface between the encapsulating layer 24 and the low-index gap 18 and be redirected again by the scattering layer 22. Scattered light that is directed toward the reflective electrode 16 will be reflected from the electrode and redirected again by the scattering layer 22. In this fashion, light will either be emitted from the OLED device or redirected repeatedly by the scattering layer 22 until the light is emitted from the OLED device. It is preferred that the various layers 12, 14, 22, 24, and 26 be as transparent as possible and the reflective electrode 16 be as reflective as possible to minimize the absorption of light within the OLED device.

In preferred embodiments, the cover 20 and substrate 10 may comprise glass or plastic with typical refractive indices of between 1.4 and 1.6. The transparent low-index element 18 may comprise a solid layer of optically transparent material, a void, or a gap. Voids or gaps may be a vacuum or filled with an optically transparent gas or liquid material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. Reflective electrode 16 is preferably made of metal (for example aluminum, silver, or magnesium) or metal alloys. Transparent electrode 12 is preferably made of transparent conductive materials, for example indium tin oxide (ITO) or other metal oxides. The organic material layers 14 may comprise organic materials known in the art, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.1. Hence, the various layers 12 and 14 in the OLED have a refractive index range of 1.6 to 2.1. Of course, the refractive indices of various materials may be dependent on the wavelength of light passing through them, so the refractive index values cited here for these materials are only approximate. In any case, the transparent low-index element 18 preferably has a refractive index at least 0.1 lower than that of each of the first refractive index range and the second refractive index at the desired wavelength for the OLED emitter.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix 23 of lower refractive index and scattering particles 21 with a higher refractive index. Alternatively, the matrix 23 may have a higher refractive index and the scattering particles 21 may have a lower refractive index. For example, the matrix may comprise silicon dioxide or cross-linked resin having indices of approximately 1.5, or silicon nitride with a much higher index of refraction. If scattering layer 22 has a thickness greater than one-tenth part of the wavelength of the emitted light, then it is desirable for the index of refraction of at least one material in the scattering layer 22 to be approximately equal to or greater than the first refractive index range. This is to insure that all of the light trapped in the organic layers 14 and transparent electrode 12 can experience the direction altering effects of scattering layer 22. If scattering layer 22 has a thickness less than one-tenth part of the wavelength of the emitted light, then the materials in the scattering layer need not have such a preference for their refractive indices.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the cover 20, for top emitters, and on the transparent substrate 10, for bottom emitters.

The scattering layer 22 can employ a variety of materials. For example, randomly located particles of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 μm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide. The scattering layer may be colored, to filter the emitted light.

Conventional lithographic means can be used to create the scattering layer using, for example, photo-resist, mask exposures, and etching as known in the art. Alternatively, the scattering layer may be sputtered or a coating may be employed in which a liquid, for example polymer having a dispersion of titanium dioxide, may form a scattering layer 22.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. In addition to employing encapsulation layers as described herein, cover 20 may be an encapsulating edge sealed cover as is known in the art. Methods for edged encapsulation and desiccation include, but are not limited to, e.g., those described in U.S. Pat. No. 6,226,890 issued May 8, 2001 to Boroson et al.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof; but it will be understood that variations and modifications can be effected within the spirit and scope of the invention.

PARTS LIST

| | |
|---|---|
| 1, 2, 3, 4, 5 | light rays |
| 10 | substrate |
| 12 | transparent electrode |
| 14 | organic layer(s) |
| 16 | reflective electrode |
| 18 | transparent low-index element |
| 19 | gap |
| 20 | cover |
| 21 | scattering particles |
| 22 | scattering layer |
| 23 | matrix |
| 24 | second encapsulating layer |
| 26 | first encapsulating layer |
| 30, 32, 34, 36, 38 | pixels |

The invention claimed is:

1. An OLED device, comprising:
one or more OLED elements including first and second spaced-apart electrodes with one or more organic layers formed there-between, at least one organic layer being a light-emitting layer, wherein at least one of the electrodes is a transparent electrode, and
wherein the light-emitting layer has a first refractive index;
a first transparent encapsulating layer formed over the transparent electrode opposite the organic layer;
a scattering layer formed over the first encapsulating layer opposite the transparent electrode;
a second encapsulating layer formed over the scattering layer opposite the first transparent encapsulating layer;
a transparent cover through which light is emitted having a second refractive index; and
a low-index element having a refractive index lower than the first and second refractive indices formed between the second encapsulating layer and the transparent cover.

2. The OLED device of claim 1 wherein the first transparent encapsulating layer is less than 400 nm thick.

3. The OLED device of claim 1 wherein the first transparent encapsulating layer is less than 100 nm thick.

4. The OLED device of claim 1 wherein the first and second encapsulating layers are formed of different materials.

5. The OLED device of claim 1 wherein the first encapsulation layer is formed of a plurality of separately deposited layers of one or more types of material.

6. The OLED device of claim 5 wherein at least one of the first encapsulation layers is deposited by atomic layer deposition.

7. The OLED device of claim 6 wherein the first transparent encapsulating layer is less than 100 nm thick.

8. The OLED device of claim 1 wherein the second encapsulation layer is deposited through evaporation, coating, sputtering, or atomic layer deposition.

9. The OLED device of claim 1 wherein the second encapsulating layer comprises parylene, metal oxide, silicon oxide, or silicon nitride.

10. The OLED device of claim 1 wherein the first encapsulating layer comprises a metal or silicon oxide.

11. The OLED device of claim 1 wherein the first encapsulating layer is less than one micron thick and the second encapsulating layer is more than one micron thick.

12. The OLED device of claim 1 wherein the scattering layer comprises titanium dioxide particles.

13. The OLED device of claim 1 wherein the scattering layer includes at least one material having a higher optical index than the first and second encapsulating layers.

14. The OLED device of claim 1 wherein at least one of the first and second encapsulating layers have a lower optical index than the first refractive index.

15. The OLED device of claim 1, wherein the scattering layer includes at least one material having a refractive index equal to or greater than the first refractive index and the refractive index of the encapsulation layer.

16. The OLED device of claim 1, wherein the scattering layer includes a matrix material with a relatively lower index of refraction and a scattering material with a relatively higher index of refraction.

17. The OLED device of claim 16, wherein the second encapsulation layer and the scattering layer matrix material comprise the same material or comprise different materials with matched indices of refraction.

18. The OLED device of claim 1 wherein the second encapsulating layers is thicker than the first encapsulating layer.

19. The OLED device of claim 1 wherein the low-index element is a gas or vacuum.

20. The OLED device of claim 1, wherein the scattering layer comprises a solvent-coated layer.

* * * * *